（12）United States Patent
Rayssac et al.

(10) Patent No.: US 7,892,946 B2
(45) Date of Patent: Feb. 22, 2011

(54) DEVICE AND METHOD FOR CUTTING AN ASSEMBLY

(75) Inventors: Olivier Rayssac, Grenoble (FR); Fabrice Letertre, Grenoble (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 524 days.

(21) Appl. No.: 11/681,349

(22) Filed: Mar. 2, 2007

(65) Prior Publication Data

US 2007/0148915 A1 Jun. 28, 2007

Related U.S. Application Data

(62) Division of application No. 10/886,436, filed as application No. PCT/FR02/04594 on Dec. 31, 2002, now Pat. No. 7,232,738.

(30) Foreign Application Priority Data

Jan. 3, 2002 (FR) .................................. 02 00024

(51) Int. Cl.
*H01L 21/46* (2006.01)
(52) U.S. Cl. ........................ 438/458; 156/344; 83/177
(58) Field of Classification Search ................ 438/458; 156/344; 83/177
See application file for complete search history.

(56) References Cited

U.S. PATENT DOCUMENTS

| | | | | |
|---|---|---|---|---|
| 5,897,743 A | * | 4/1999 | Fujimoto et al. | ............. 156/584 |
| 5,985,742 A | * | 11/1999 | Henley et al. | ................ 438/515 |
| 6,033,974 A | * | 3/2000 | Henley et al. | ................ 438/526 |
| 6,221,740 B1 | | 4/2001 | Bryan et al. | ................ 438/458 |
| 6,284,631 B1 | | 9/2001 | Henley et al. | ................ 438/526 |
| 6,418,999 B1 | * | 7/2002 | Yanagita et al. | ............. 156/584 |
| 6,468,879 B1 | | 10/2002 | Lamure et al. | .............. 438/458 |
| 6,821,376 B1 | | 11/2004 | Rayssac et al. | .............. 156/344 |

FOREIGN PATENT DOCUMENTS

| | | | |
|---|---|---|---|
| FR | 2 785 217 A1 | | 5/2000 |
| FR | 2796491 A1 | | 1/2001 |
| FR | 1 107 295 A1 | | 6/2001 |
| GB | 2068291 | * | 8/1991 |
| JP | 2000-100678 A | | 4/2000 |
| JP | 2001-525991 | | 12/2001 |
| WO | WO 98/52216 A1 | | 11/1998 |
| WO | WO 00/26000 A1 | | 5/2000 |
| WO | WO 01/04933 A1 | | 1/2001 |

OTHER PUBLICATIONS

Office Action, Sep. 28, 2010, Japanese Application No. 2003-559737, with English translation.

* cited by examiner

*Primary Examiner*—Stephen Choi
(74) *Attorney, Agent, or Firm*—Winston & Strawn LLP

(57) ABSTRACT

A method is presented for cutting an assembly that includes two layers of material having a first surface and a second surface. The method includes providing a weakened interface between the two layers that defines an interface ring about the periphery of the assembly, providing a high-pressure zone at the interface ring, and providing at least one controllable low-pressure zone in the vicinity of at least one of the first surface and the second surface. The technique also includes supplying the high-pressure zone with a controllable high-pressure force, and attacking the interface ring with at least one mechanical force in combination with the high-pressure force to cut the assembly.

15 Claims, 2 Drawing Sheets

DEVICE AND METHOD FOR CUTTING AN ASSEMBLY

CROSS-REFERENCE TO RELATED APPLICATIONS

This application is a divisional of U.S. application Ser. No. 10/886,436 filed Jul. 6, 2004, now U.S. Pat. No. 7,232,738 which is a continuation of International application no. PCT/FR02/04594 filed Dec. 31, 2002, the entire contents of each of which are expressly incorporated herein by reference thereto.

BACKGROUND ART

The present invention relates generally to preparing substrates for electronics, optics or optoelectronics. More specifically, the invention relates to a method for precisely cutting an assembly formed of two layers of material that has two principal surfaces. The method includes providing a weakened interface between the two layers, wherein the interface defines an interface ring at the periphery of the assembly. A first high-pressure zone is provided whose border includes at least one part of the interface ring, and at least one second low-pressure zone is formed whose pressure is controlled relative to one part at least of a principal surface of the assembly. The high-pressure zone is supplied with a fluid, whose pressure is controlled.

For the purposes of this text, the term "cutting" is understood to mean the operation of dividing a single element or assembly into two physically separate parts wherein the parts do not combine again.

Methods for cutting two layers of material of an assembly are well-known, for example, as disclosed in International Application No. WO 01/04933. That document also describes a device for implementing the method. In particular, this document describes the production of at least one cavity in the interface zone, the cavity then being used for initiating the cutting of the two layers defined by the interface. A limitation of the disclosure of this document is that it only enables cutting of layers that have been previously bonded together, so that the weakened interface is necessarily a bonding interface. It would be advantageous to be able to implement a method of this type for cutting layers separated by any type of weakened interface. It would thus be advantageous to be able to implement a method of the aforesaid type, for example, for cutting layers separated by a weakened interface that has been defined by implantation of elements such as ions or atoms in a substrate of material (the two layers being thus produced using the same material).

One way of defining a weakened interface in a substrate of the type used for electronics, optics, or optoelectronics includes implanting elements such as hydrogen ions in the substrate mass using a controlled implantation energy to precisely define the depth of implantation of the elements. One such substrate (called a 'wafer' according to the generally accepted terminology) can be, for instance, a semiconductor material such as silicon.

It is also possible to produce a weakened interface by using any other known method, for example, by constructing an intermediate zone of porous material between two zones of dense material. For example, by using a layer of oxide embedded in a substrate (a silicon-on-insulator (SOI) type substrate, for example). The bonding of the two layers is thus only one particular way of creating a weakened interface between two layers.

The present invention seeks to implement a method of the aforesaid type for cutting an assembly at a weakened interface that has been formed by one of the hereinbefore described means, or by any other known method.

It is noted that that other methods are known that enable cutting of layers separated by a weakened interface created by implantation of atomic particles. An example of one such method can be found in U.S. Pat. No. 6,221,740. But that method does not provide the specific advantages of the type of method described in International Application No. WO 01/04933. In particular, the method does not teach how to precisely control the pressure in the two different zones (corresponding to the high-pressure zone and the low-pressure zone mentioned above). Such control is important for performing the cutting operations with precision and for avoiding the risks of degrading the wafers, which are fragile and which are expected to have an extremely high surface quality after cutting. The device described in U.S. Pat. No. 6,221,740 thus does not enable one to control the pressure in one single zone of high pressure, which is adjacent to at least one part of the interface ring. And it must be noted that even this control cannot be carried out in a precise manner due to the significant risk of leakage at the interface ring (a certain tightness being provided by an O-ring seal positioned relative to the interface ring), although as stated in U.S. Pat. No. 6,221,740 (see col. 4, lines 21-22 and lines 34-36) this tightness is relative.

Furthermore, U.S. Pat. No. 6,221,740 does not have the advantageous structure type described in International Application No. WO 01/04933, which not only enables defining at least one high-pressure zone and one low-pressure zone in which the pressure can be precisely controlled, but moreover enables the assembly to be cut to deform freely when being cut (namely owing to the absence of contact on a significant portion of the principal surfaces of the assembly). Thus, the structures of the devices of International Application No. WO 01/04933 and U.S. Pat. No. 6,221,740 exhibit fundamental differences that correspond to fundamental functional differences.

It would thus be advantageous to preserve the advantages of the method of International Application No. WO 01/04933 (including controlling both the high and low pressure to precisely control the loads applied to the assembly as well as generally allowing the assembly to deform freely during cutting), wherein these advantages are absent in the configuration described by U.S. Pat. No. 6,221,740. It would also be beneficial to enable efficient cutting at a weakened interface that would be produced by any means (by implantation, for example), which is not suggested in the method and device of International Application No. WO 01/04933, which is strictly limited to cutting a weakened interface corresponding to a bonding interface.

SUMMARY OF THE INVENTION

A method is presented for cutting an assembly that includes two layers of material having a first surface and a second surface. The method includes providing a weakened interface between the two layers that defines an interface ring about the periphery of the assembly, providing a high-pressure zone at the interface ring, and providing at least one controllable low-pressure zone in the vicinity of at least one of the first surface and the second surface. The technique also includes supplying the high-pressure zone with a controllable high-pressure force, and attacking the interface ring with at least one mechanical force in combination with the high-pressure force to cut the assembly. The method provides high-precision cutting of the two layers.

Advantageously, the weakened zone is provided by at least one of implanting atomic species and forming a thin porous layer between the two layers of material. The high-pressure force includes at least one of a pressurized fluid and a pressurized gas. In an implementation, the assembly is placed in a receptacle, wherein the high-pressure zone and each low-pressure zone are defined by O-rings that cooperate with the assembly. Advantageously, the method includes controlling the pressure to progressively increase in the high-pressure zone. A control loop may be provided to increase the pressure as a function of the progress of a separation front that is created when cutting.

In a variation, the method includes establishing a low-pressure zone relative to both the first and second surfaces of the assembly. The pressures of the two low-pressure zones may advantageously be separately and differently controlled. In a beneficial embodiment, the at least one mechanical force comprises at least one blade. An independent high-pressure supply may advantageously be associated with each blade to attack the assembly, and a high pressure zone may be established by each blade which includes a high-pressure supply. In a preferred embodiment, at least one of a traction force and a shearing force is applied to the first and second surfaces of the assembly.

Another aspect of the invention is a device for cutting an assembly having two layers of material and a weakened interface therebetween, wherein the weakened interface defines an interface ring about the periphery of the assembly. This devices comprises a housing adapted for accepting the assembly; at least one blade for attacking the assembly at the interface ring; and at least one further element that cooperates with the blade and interface ring to facilitate cutting of the assembly.

The further element may be at least one seal element for establishing a high-pressure zone between the housing and the assembly at the level of the interface ring, and for establishing a low-pressure zone at a surface of the assembly. Preferably, a second seal element is provided for defining the high pressure zone between the housing and the assembly, and for establishing a second low-pressure zone at a second surface of the assembly, wherein cutting is facilitated by controlling the pressure in at least one of the high pressure and the low pressure zones.

Alternatively, the further element may be at least one gripper for applying a complementary mechanical action on at least one surface of the assembly. In this embodiment, the further element further comprises at least one seal element for establishing a high-pressure zone between the at least one blade and the interface ring.

In an implementation, the at least one seal element of the device is an O-ring. Advantageously, the device further includes an independent high-pressure supply for each blade of the device. In an embodiment, at least one blade comprises an internal supply conduit for directing a fluid or a gas under high-pressure. The device may also include a control loop for controlling the increase of high pressure as a function of the progress of a separation front created during cutting. In a beneficial implementation, the device includes a second seal element for defining the high pressure zone between the housing and the assembly, and for establishing a second low-pressure zone at a second surface of the assembly, wherein cutting is facilitated by controlling the pressure in at least one of the high pressure and the low pressure zones. The device may also advantageously include at least one gripper for applying a complementary mechanical action on at least one of two surfaces of the assembly. The complementary mechanical action includes at least one of a traction force perpendicular to the surfaces of the assembly and a shearing force oriented in the plane of the weakened interface.

In another aspect according to the invention, provided is a device for cutting an assembly having two layers of material having a weakened interface therebetween, wherein the weakened interface defines an interface ring about the periphery of the assembly. The device includes at least one blade, at least one seal element and at least one gripper. The at least one blade is used to attack the assembly at the interface ring, the blade including an internal supply conduit for supplying at least one of a fluid or a gas under high pressure. The at least one seal element establishes a high-pressure zone between the at least one blade and the interface ring, and the at least one gripper applies a complementary mechanical action on at least one surface of the assembly.

In an advantageous implementation, the at least one seal element is an O-ring. The device may also include an independent high-pressure supply for each blade, and may include a control loop for controlling the increase of high pressure as a function of the progress of a separation front created during cutting. The complementary mechanical action advantageously includes at least one of a traction force perpendicular to the surfaces of the assembly and a shearing force oriented in the plane of the weakened interface.

BRIEF DESCRIPTION OF THE DRAWINGS

Other aspects, purposes and advantages of the invention will become clear after reading the following detailed description with reference to the attached drawings, in which:

FIG. 2b is a schematic top view of the device shown in FIG. 2a.

DETAILED DESCRIPTION OF THE PREFERRED EMBODIMENTS

By way of introduction to the following description of different alternative embodiments of the invention, it should be noted that the examples described below represent cutting an assembly 10 that includes two layers of material separated by a weakened interface. The two layers are arranged on either side of the weakened interface and can be made of the same material or of different materials. The weakened interface can be produced by any known method. In particular, the weakened interface can be produced by implanting elements as hereinbefore mentioned, or even by any other known means (for example, by forming a thin porous layer between the two layers which then corresponds to the weakened interface).

It is also noted that, although the figures illustrating the assembly show two relatively thick layers, in reality these layers can be extremely thin. In particular, in one preferred application of the invention, the assembly can be a Silicon-On-Insulator (SOI) substrate type (or, more generally, a Silicon-On-Anything (SOA) assembly, according to generally accepted terminology for such substrates, or even an—Anything-On-Anything (AOA) type substrate). Hereinafter, the assembly 10 may also be referred to as a "wafer."

Figure 1A:
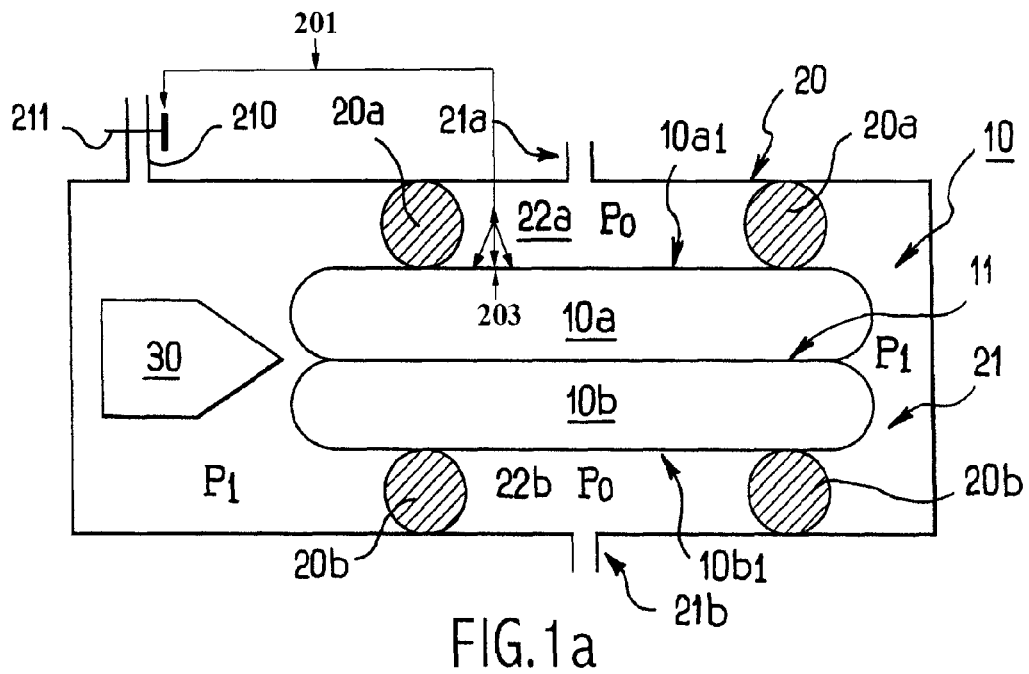
FIG. 1a is a simplified schematic side view representation of a first embodiment of a device according to the invention that includes a blade.

FIG. 1a illustrates a wafer 10 comprising two layers 10a and 10b that are separated by a weakened layer or weakened interface 11. A first principal surface 10a1 of the wafer 10 is located on the surface of the first layer 10a opposite the weakened interface 11. A second principal surface 10b1 is located on the surface of the second layer 10b opposite the other side of the weakened interface 11. The wafer 10 thus includes two layers 10a and 10b separated by a weakened interface 11, wherein the two layers define the two principal surfaces 10a1 and 10b1 at their respective external surfaces. The weakened interface 11 defines a circular line at the periphery of the wafer that shall be referred to as the "interface ring".

The wafer 10 typically has a circular shape, the two layers 10a and 10b thus take the form of two superimposed disks joined by the weakened interface 11. As mentioned above, the weakened interface can be produced by any known method. It should be noted that the wafer 10 might be prepared by undergoing a specific treatment to facilitate cutting along the weakened interface 11. One such preparation treatment, for example, may include subjecting the wafer 10 to a high-temperature annealing type thermal treatment. More particularly, if the weakened interface is produced by implantation, such a thermal treatment preparation can enable "over-weakening" of the interface 11, it being understood that the thermal budget utilized during such a treatment step must remain below the thermal budget required to completely cleave or detach the two layers 10a and 10b. In this manner, cutting (that is, the operation enabling definitive separation of the two sections 10a and 10b from each other) is facilitated.

The wafer is placed in a receptacle or housing 20 that enables at least one high-pressure zone and one low-pressure zone to be defined. More specifically, the housing 20 comprises two O-rings 20a and 20b that are tightly or securely arranged against the respective principal surfaces 10a1 and 10b1 of the wafer. Each O-ring is thus concentrically arranged relative to the wafer. Each O-ring 20a, 20b is also in tight contact with the wall of the housing 20. Such a configuration thus produces a peripheral zone 21 that encompasses the wafer 10 at its lateral wall and includes the zone corresponding to the interface ring, and two zones 22a and 22b that are delimited by the respective O-rings 20a and 20b and which are arranged to include the two principal surfaces of the wafer, inside the housing or receptacle 20.

In FIG. 1a, it is important to note the presence of a fluid inlet 210 for supplying the zone 21 with a fluid under controlled pressure (for example, by way of a valve 211). The zone 21 is the "high-pressure" zone because the controlled pressure of the fluid being supplied to the zone 21 is greater than the pressure that exists in the zones 22a and 22b. In fact, the pressure that exists in the two zones 22a and 22b can also be controlled by any known means. It should be noted that the fluid that fills the zones 22a and 22b can simply be air or even a specific gas mixture or, generally, any fluid or mixture of fluids adapted for controlling the pressure on the external surfaces of the wafer. Likewise, the fluid arriving via the supply 210 can be any fluid adapted to provide high pressure in the zone 21 which aids, as will be shown, in the cutting of the two layers of the wafer. It is noted that the fluid used to establish the high pressure zone may have chemical properties enabling it to attack the interface 11 and thus facilitate cutting (for example, if an oxide layer is to be cut, a liquid or gaseous HF fluid could be used).

Figure 1B:
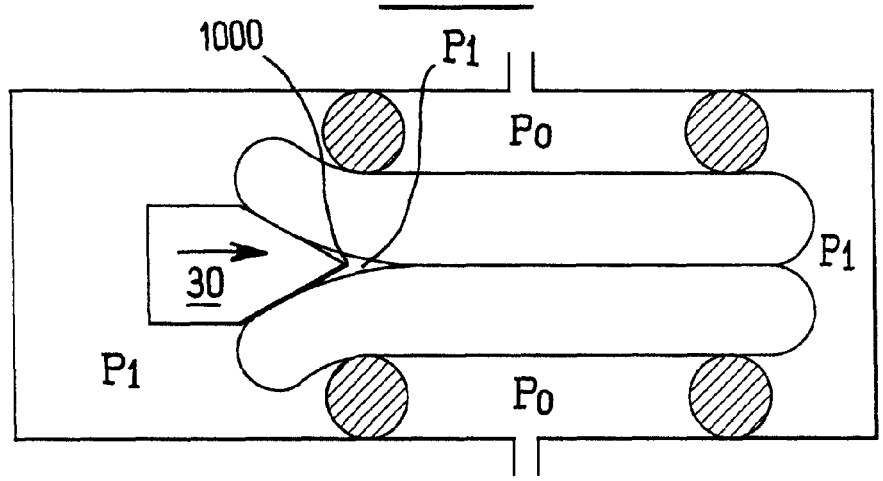
FIG. 1b is a similar view of the device of FIG. 1a, wherein the blade has begun cutting the assembly.
Figure 1C:
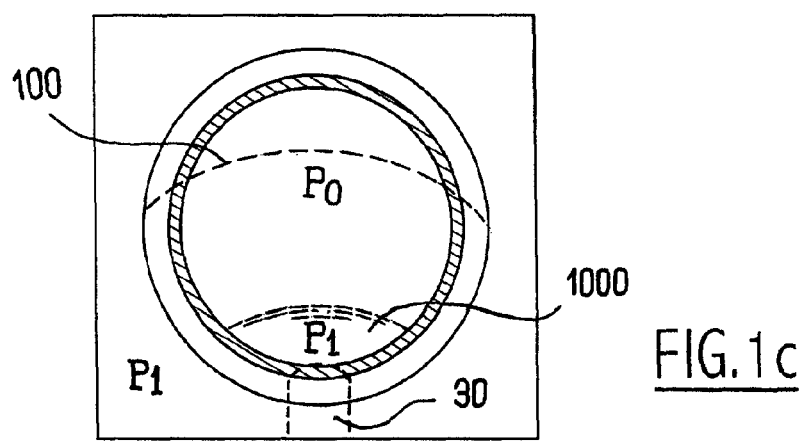
FIG. 1c is a schematic top view of the device of FIG. 1a, wherein the blade of the device is in a position corresponding to that of FIG. 1b.

In the embodiment represented in FIGS. 1a to 1c, the pressure of zones 22a and 22b is simply controlled by means of two vents 21a and 21b that allow air (or generally, a fluid) contained in these respective two zones to freely communicate with the ambient atmosphere surrounding the housing 20. In this case, the "low pressure" of zones 22a and 22b is controlled to correspond to the surrounding pressure. In the case of a receptacle placed in air at atmospheric pressure, the low pressure is thus controlled in a manner so as to be equal to the atmospheric pressure.

It is also important to note (particularly in FIGS. 1a and 1b) the presence of a blade 30 that is arranged in the high-pressure zone 21. The blade 30 is placed in the axis of the weakened interface 11, the leading edge of the blade being arranged at the level of the interface ring corresponding to the weakened interface 11. In addition, the blade 30 is mounted on specific control means that enables the regulation of its displacement in the plane of the weakened interface 11 (these specific control means are not shown but can be of any known type).

The O-rings 20a and 20b can be replaced by seals that have another shape or by any specific means that enable the establishment of a tight seal between the zone 21 and the zones 22a and 22b. Further, it is possible according to the invention to define only one zone 22a or 22b with regard to only one of the two principal surfaces of the wafer. In this case, the other face of the wafer can be enclosed by the high-pressure zone 21. In particular, the configuration of the low-pressure zones could be adapted to favor deformation of one of the two layers 10a or 10b of the wafer, which may be determined as a function of the respective materials comprising the two layers. In fact, in the case of the two layers of two different materials, it is possible and it may be desirable to encourage deformation of one of the two layers during cutting. In such a case, a low-pressure zone relative to the principal surface of the wafer that corresponds to the desired layer could be formed. It is also be possible to control the "low pressures" of the two zones 22a and 22b separately and differently to apply a pressure differential between the two layers, and thus provide a greater load on one of the layers. The pressure of the fluid supplied in the high-pressure zone 21 can also be controlled to progressively establish a high-pressure in this zone. In this case, it would be possible to define any control sequence to produce such a pressure increase more or less rapidly and/or more or less continuously.

Referring to FIGS. 1b and 1c, in conjunction with establishing a high pressure P1 in the zone 21 (pressure P1 being greater than pressure P0 existing in the zones 22a and 22b), movement of the blade 30 is controlled so that the leading edge of the blade attacks the wafer at the level of its interface ring. The interface ring corresponds to the intersection of the weakened interface 11 and the periphery of the wafer 10. Also, while the two layers of the wafer 10 are shown have beveled edges in the figures, it is also possible that these edges are more or less sharply defined. The position of the leading edge of the blade, which is perpendicular to the principal surfaces of the wafer, is aimed precisely so that when it is displaced the leading edge of the blade attacks the wafer at the interface ring. However, it is also possible to combine the blade 30 with means that allow a certain amount of freedom in the vertical direction to enable self-adjustment of the vertical position of the leading edge of the blade as it comes into contact with the interface ring. One such self-adjustment can be implemented when the interface ring is defined by beveled edges of the layers 10a and 10b. In this case, the interface ring is located between the beveled edges which will guide the leading edge of the blade towards the weakened interface 11 at the time of the attack.

FIG. 1b shows the device according to the invention wherein the blade 30 has attacked the weakened interface 11 and has started to separate the two layers 10a and 10b. It should be noted that the different elements shown in the figures are not drawn to scale but are drawn for ease of understanding only, and thus do not represent reality. For example, when the blade 30 attacks an SOI structure, the two layers 10a and 10b are separated only by the width of the blade, which can be on the order of a millimeter. In addition, the deformation of the layers 10a and 10b as shown in FIG. 1b is greatly exaggerated. In any case, penetration of the blade between the two layers 10a and 10b enables the creation and propagation of a separation front between the two layers, and such a separation front 100 is schematically shown in FIG. 1c. In the field of cutting SOI structures, for example, it is known that it is possible to observe such separation fronts (for example, by measurement of the reflection and/or transmission of a light ray such as an infrared light ray illuminating the wafer as it is being cut).

The blade 30 attacks the wafer only on one small portion of its periphery. In this respect, the contour of the blade may correspond to a projecting geometry to attack the wafer on one small portion of its periphery as shown in the top view of FIG. 1b. It is also possible to define a different geometry for the blade 30, for example, a concave "crescent" profile when viewed from above (corresponding to the view in FIG. 1c). In this case, the leading edge of the blade would then co-operate with an entire angular sector of the periphery of the wafer. In any case, when the blade 30 attacks the wafer and induces separation between the two layers 10a and 10b (the O-rings 20a and 20b being disposed in a recess from the periphery of the wafer 10 in such a fashion that such initial separation is possible), the fluid under high pressure in zone 21 can penetrate (including on the sides of the blade) between the two layers 10a and 10b on the sides and ahead of the blade 30. In this manner, a zone 1000 is created between the two layers 10a and 10b ahead of the blade 30, in which the pressure is substantially equal to P1.

Once the blade has progressed sufficiently between the two layers 10a and 10b so that the zone 1000 is parallel to the principal surfaces of the wafer that are enclosed by the seals 20a and 20b, at least one part of the layers 10a and 10b is subjected to a separating stress from the other layer as a result of the pressure differential (P1-P0). The pressure differential thus facilitates the separation of the two layers 10a and 10b. It is noted in this respect that the configuration of the device according to the invention makes it possible to free the two layers 10a and 10b to deform by vertically separating them from each other (contrary to that obtained using the configuration described in U.S. Pat. No. 6,221,740). Thus, the combined action of the blade and the stress generated by the pressure differential (P1-P0) makes it possible to cut the wafer under optimal conditions.

In a preferred embodiment, the elasticity of the seals 20a and 20b is defined to allow a certain separation of the layers 10a and 10b from each other to enable the completion of cutting, while guaranteeing a good seal between the high-pressure zone and each low-pressure zone. Moreover, the pressure levels P1 and P0 are defined as a function of the desired parameters for the cutting operation (taking into account the component materials of the two wafer layers). In any case, the progressive establishment of an overpressure P1 in the zone 21 aids the cutting operation by preventing any rupture of the layers 10a and 10b.

It is also possible to establish a control loop for controlling the pressure increase in zone 21 as a function of observed progress of the separation front 100. This observation of the separation front can be made, for example, by monitoring the optical characteristics of the surface of the wafer, for example, by using visible and/or infrared light. FIG. 1a illustrates control loop 201, which receives input from optical monitoring device 203 concerning the progress of separation, and which controls valve 211 to supply zone 21 with controllable high pressure fluid.

Figure 2A:
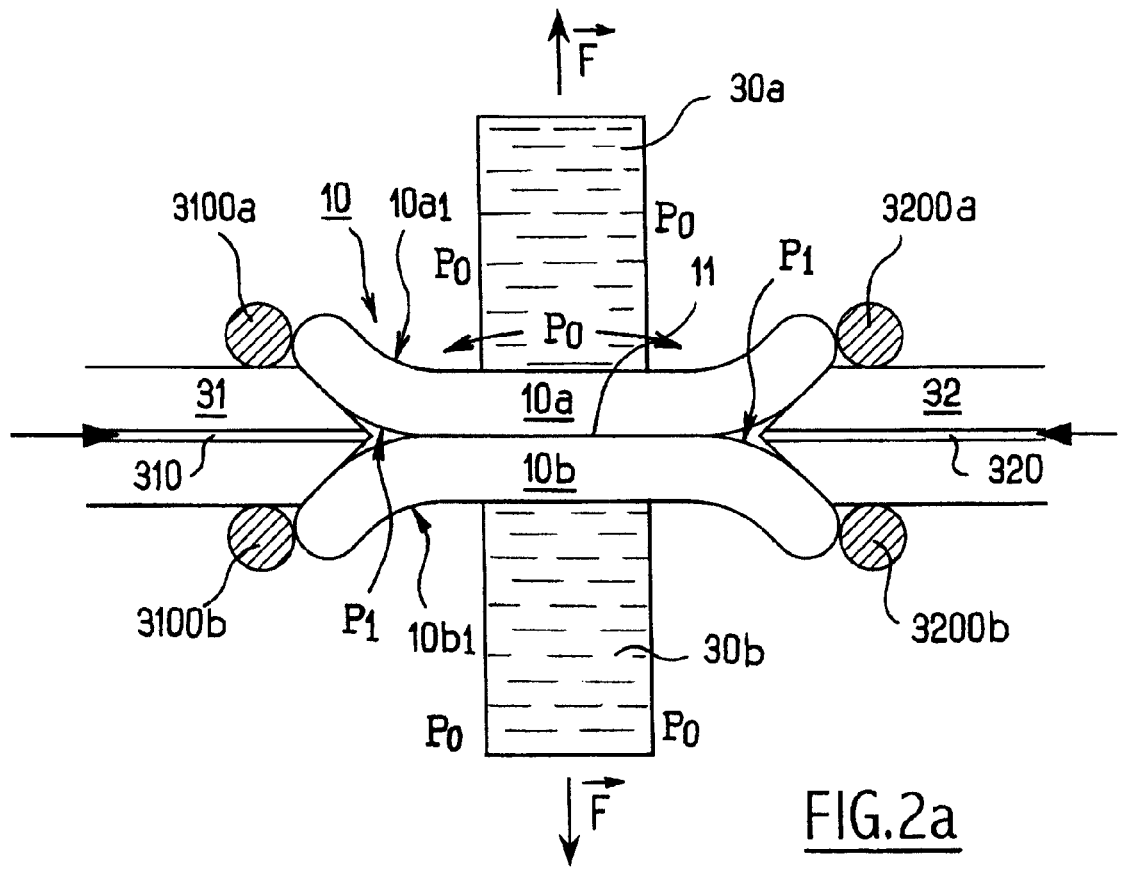
FIG. 2a is a simplified schematic side view representation of a device corresponding to a second alternative embodiment according to the invention.
Figure 2B:
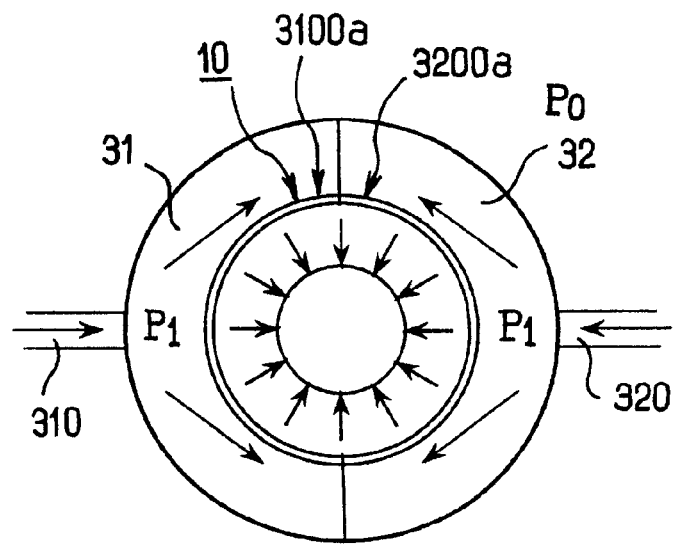

FIGS. 2a and 2b illustrate a second alternative embodiment of the invention. FIG. 2a depicts the same wafer 10 subjected to attack by at least one blade that includes a high-pressure fluid supply means. In the example in FIG. 2a, the wafer 10 is subjected to attack by two moveable blades 31 and 32 that are diametrically opposed to each other on either side of the wafer, in the same plane as the weakened interface 11. However, one of the blades can remain fixed and/or could include a holder for the wafer. This holder also would contribute to establishing a tight seal between the high pressure and low pressure zones by virtue of the seals that are attached on the two surfaces (the configuration and the role of the seals being explained below).

Each blade 31, 32 includes an internal supply conduit 310, 320 connected to a high pressure fluid reservoir. A means is provided therein for controlling the establishment of a high pressure P1 in the conduit, and the conduit opening is at the level of the leading edge of the blade. In this alternative embodiment, the establishment of a high pressure at the level of the interface ring is caused by injection of a fluid under pressure through the conduit of the blade after initiation of the attack of the wafer by the blade(s) (as shown by the position of the blades shown in FIG. 2b in which a seal is established between the high and low pressure zones). In this embodiment, a high-pressure zone is created at the interface ring, to attack the weakened interface and create a high pressure zone ahead of each blade so that the layer(s) of the wafer are subjected to a pressure differential.

The embodiment of FIGS. 2a and 2b corresponds to a particularly simple configuration for implementation of the invention, because the low-pressure zones near the principal surfaces of the wafer correspond simply to zones exposed to ambient atmospheric pressure (P0). It is however possible to expressly define the low-pressure zones with respect to the principal surfaces (or only one of the principal surfaces) of the wafer. For example, the wafer could be placed into a receptacle and seals could be used to define zones in the receptacle, so that the high pressure P1 is constantly provided by an internal conduit of the blade (or of the blades) that attack(s) the wafer. It is noted that complementary means are also provided to assure a tight seal between the low-pressure zones (in particular the zones arranged relative to the principal surfaces of the wafer) and the high pressure zones (in particular the zones disposed ahead of the blades 31 and 32 at the time the wafer is attacked by the blades, see FIG. 2a). The complementary means can take the form, as in FIGS. 2a and 2b, of portions or parts of O-rings 3100a, 3100b, 3200a and 3200b. As shown more particularly in FIG. 2a, two seals 3100a and 3100b are thus affixed on the two respective surfaces above and below the blade 31.

The blade has an overall geometry in the form of a half-ring (see FIG. 2b) whose inside diameter (the diameter of the central cavity of the half-ring) is less than the external diameter of the peripheral ring of the wafer by a distance corresponding to the desired depth of attack of the blade into the wafer. In this implementation, the two blades 31 and 32 are identical and symmetrically arranged (as well as their respective O-rings), and the clamping of the two blades produces a ring that attacks the wafer ring on its entire periphery by penetrating the wafer only to a desired depth. Each portion of the O-ring 3100a, 3100b thus has the shape of a half-ring that is fixed on it blade side in proximity to the leading edge of the blade. In particular, the distance between the seal and the leading edge is defined so that when the blade attacks the wafer the peripheral part of the respective layer 10a and 10b arranged relative to the seal makes tight contact on the seal. Thus, a seal is created between the external environment of the wafer (exposed to the "low" atmospheric pressure P0, although this pressure could be controlled in a sealed receptacle to have an entirely different value) and the zones of the wafer in which in which a desired high pressure is established (zones situated between the two layers 10a and 10b and ahead of the leading edge of the blade).

It is noted that the blades 31 and 32 are identical and arranged symmetrically relative to the wafer as well as to their respective seals 3100a, 3100b and 3200a, 3200b. It is also noted that, in terms of clamping of the blades on the wafer, the ends of the seal 3100a make tight contact with those of the seal 3200a of the opposing blade in such fashion as to create on the top of the blades an annular tight O-ring. The same also applies under the blade with regard to the seals 3100b and 3200b. In this fashion, complete tightness or a complete seal is established between the low and the high pressure zones.

FIG. 2b schematically illustrates the particular geometry of the blades 31 and 32 which, in this embodiment, each have a half-ring shape when viewed from above. In this case, the two blades 31 and 32 approach each other until the rectilinear portions of their leading edges (the portions corresponding to a radius of the ring, the leading edge of each blade between these two peripheral portions having a leading edge with a contour, when viewed from above, that corresponds to the contour of the central space of the half-ring) meet, and the cutting is then completed.

It is noted that it is not necessary for the blade to completely penetrate the wafer surface. In fact, in the different alternative embodiments of the invention, it is possible to carry out the cutting operation entirely by having the blade penetrate the wafer only to a limited depth and then to rely on the pressure differential (P1-P0) to perform cutting to finish separating the layers.

It is also important to note in FIG. 2a the presence of two gripping elements 30a and 30b which contact the respective faces 10a1 and 10b1 of the wafer. These gripping elements can include, for example, suction cups or suction means on their faces that are in contact with the principal surface of the wafer. The gripping elements 30a and 30b can thus aid in the separation of the layers 10a and 10b to facilitate cutting, and these gripping elements can be controlled by controlling the distance from each other (so as to exert a traction force to directly facilitate separation of the layers 10a and 10b). It is also possible to control the movement of these elements 30a and 30b in the direction of the plane of the weakened interface 11, the two elements having displacements in the opposing directions in such a fashion as to generate shearing forces to further facilitate cutting of the layers 10a and 10b.

What is claimed is:

1. A device for cutting an assembly having two layers of material and a weakened interface there between, wherein the weakened interface defines an interface ring about the periphery of the assembly, comprising:
    a housing adapted for accepting the assembly;
    at least one blade without a fluid supply means for attacking the assembly at the interface ring; and
    at least one further element that cooperates with the blade and interface ring to facilitate cutting of the assembly; wherein the further element comprises a first seal element for establishing a high-pressure zone between the housing and the assembly at the level of the interface ring, and for establishing a first low-pressure zone at a first surface of the assembly; and a second seal element for further defining the high pressure zone between the housing and the assembly, and for establishing a second low-pressure zone at a second surface of the assembly;
    wherein cutting is facilitated by controlling the pressure in at least one of the high pressure and the low pressure zones.

2. The device of claim 1 wherein the further element is at least one gripper for applying a complementary mechanical action on at least one surface of the assembly.

3. The device of claim 2, wherein the cutting comprises applying complementary mechanical action comprising at least one of a traction force perpendicular to the surfaces of the assembly and a shearing force oriented in the plane of the weakened interface.

4. The device of claim 1, wherein at least one of the first or second seal elements is an O-ring.

5. The device of claim 1, wherein at least two blades are provided and which further comprises an independent high-pressure supply for each blade of the device.

6. The device of claim 1, which further comprises a control loop for controlling the increase of high pressure in the high pressure zone as a function of the progress of a separation front created during cutting.

7. The device of claim 6, wherein the control loop is operatively associated with an optical monitoring device that monitors the optical characteristics of the surface of the assembly using visible or infrared light.

8. The device of claim 1, wherein the high pressure zone is created by injection of a fluid that has chemical properties enabling it to attack the weakened interface and thus facilitate cutting.

9. The device of claim 1, wherein the low-pressure zones are configured and adapted to favor deformation of at least one of the layers of the assembly to facilitate cutting.

10. The device of claim 1, which further comprises means for controlling the low pressure zones separately and differently to apply a pressure differential between the two layers, and thus provide a greater load on one of the layers to facilitate cutting.

11. The device of claim 1, wherein the assembly has a generally circular periphery and the blade has a concave crescent profile and a leading edge that co-operates with an angular sector of the periphery of the assembly.

12. The device of claim 1, wherein the first and second seal elements have sufficient elasticity to allow separation of the layers of the assembly from each other to facilitate completion of the cutting while guaranteeing a good seal between the high pressure zone and each low-pressure zone.

13. The device of claim 12, wherein the high pressure zone is created by injection of a fluid and the creation of an overpressure in the high pressure zone aids cutting by preventing rupture of the layers of the assembly.

14. A device for cutting an assembly having two layers of material and a weakened interface there between, wherein the weakened interface defines an interface ring about the periphery of the assembly, comprising:
    a housing adapted for accepting the assembly;
    at least one blade for attacking the assembly at the interface ring; and
    at least one further element that cooperates with the blade and interface ring to facilitate cutting of the assembly; wherein the further element comprises a first seal element for establishing a high-pressure zone between the housing and the assembly at the level of the interface ring, and for establishing a first low-pressure zone at a first surface of the assembly; and a second seal element for further defining the high pressure zone between the housing and the assembly, and for establishing a second low-pressure zone at a second surface of the assembly; means for controlling the low pressure zones separately and differently to apply a pressure differential between the two layers, and thus provide a greater load on one of the layers to facilitate cutting;

wherein cutting is facilitated by controlling the pressure in at least one of the high pressure and the low pressure zones.

15. The device of claim 14 wherein the further element is at least one gripper for applying a complementary mechanical action on at least one surface of the assembly.

* * * * *

UNITED STATES PATENT AND TRADEMARK OFFICE
CERTIFICATE OF CORRECTION

| | |
|---|---|
| PATENT NO. | : 7,892,946 B2 |
| APPLICATION NO. | : 11/681349 |
| DATED | : February 22, 2011 |
| INVENTOR(S) | : Rayssac et al. |

It is certified that error appears in the above-identified patent and that said Letters Patent is hereby corrected as shown below:

Title Page:
Item (62), Related U.S. Application Data, after "10/886,436, filed" delete "as application No. PCT/FR02/04594 on Dec. 31, 2002, now Pat. No. 7,232,738." and insert -- July 6, 2004, now Pat. No. 7,232,738, which is a continuation of application No. PCT/FR02/04594 filed Dec. 31, 2002. --.
The related U.S. application data at Item (62) will then correctly appear as follows:
"Division of application No. 10/886,436, filed July 6, 2004, now Pat. No. 7,232,738, which is a continuation of application No. PCT/FR02/04594 filed Dec. 31, 2002.".

Item (56) References Cited, FOREIGN PATENT DOCUMENTS, before "1 107 295" change "FR" to -- EP --.

Signed and Sealed this
Nineteenth Day of April, 2011

David J. Kappos
*Director of the United States Patent and Trademark Office*